United States Patent [19]

Muramoto et al.

[11] Patent Number: 5,204,221

[45] Date of Patent: Apr. 20, 1993

[54] PHOTOSENSITIVE RESIN COMPOSITION

[75] Inventors: Hisaichi Muramoto, Hirakata; Yusuke Ninomiya, Nishinomiya; Keizou Ishii, Ashiya; Shinichi Ishikura, Tsuzuki, all of Japan

[73] Assignee: Nippon Paint Co., Ltd., Japan

[21] Appl. No.: 648,881

[22] Filed: Jan. 31, 1991

[30] Foreign Application Priority Data

Feb. 1, 1990 [JP] Japan .................................... 2-22946

[51] Int. Cl.$^5$ ................................................ G03C 1/73
[52] U.S. Cl. ...................................... 430/281; 430/300; 430/306; 430/18; 430/271
[58] Field of Search ................ 430/281, 300, 306, 18, 430/271; 522/79, 80, 113

[56] References Cited

U.S. PATENT DOCUMENTS

| | | | |
|---|---|---|---|
| 4,550,073 | 10/1985 | Neiss et al. | 430/281 |
| 4,994,348 | 2/1991 | Raabe et al. | 430/281 |

FOREIGN PATENT DOCUMENTS 0266069  5/1988  European Pat. Off. .

*Primary Examiner*—Jack P. Brammer
*Attorney, Agent, or Firm*—Townsend, Snider & Banta

[57] ABSTRACT

Disclosed is a photosensitive resin composition which has improved water developability and storage stability. The composition comprises (I) crosslinked resin particles prepared by a post-emulsion method from
 (a) a base resin having a glass transition temperature (Tg) of 0° C. or less and a polymerizable double bond,
 (b) a monomer which, when polymerized, provides a resin in which Tg is 20° C. higher than that of the base resin, or a resin in which Tg is 20° C. higher than that of the base resin,
 (c) a polyvinyl compound, and
 (d) a polymerization initiator
(II) a photopolymerizable unsaturated monomer, and
(III) a photopolymerization initiator.

16 Claims, No Drawings

PHOTOSENSITIVE RESIN COMPOSITION

FIELD OF THE INVENTION

The present invention relates to a photosensitive resin composition which is used for printing and photoresists. More particularly, it relates to a photosensitive resin composition which has excellent storage stability and water-developability and which is very suitable for flexographic printing, producing printed circuits and the like.

BACKGROUND OF THE INVENTION

Photosensitive resin compositions can be used for producing printing plates. Recently it has been recently desired for health and safety reasons to use photosensitive resin compositions which are water developable, i.e. which are developed with water or an aqueous medium after exposing to light.

Applicants proposed in Japanese Kokai Publication 238598/1987 that radically polymerized crosslinked resin particles, which are prepared by an emulsion polymerization method, be formulated into a photosensitive resin composition. According to the proposed technique, the water dispersibility of the composition is enhanced and, therefore, the water developability of a resin plate is enhanced. Also, the rusulting printing plate has excellent water resistance which facilitates the use of an aqueous printing ink therewith. It is, however, desired that the proposed composition is further improved in water developability and storage stability to satisfy the requirement of users.

Crosslinked resin particles can be prepared by many methods, such as by an emulsion polymerization method, a grinding method and a so-called post-emulsion method (Japanese Kokai Publication 156717/1985). In the post-emulsion method, a resin is dispersed in water and then dimensionally crosslinked within the dispersed resin particles through reactive groups present in the resin to form crosslinked resin particles which are then removed from the water.

In the post-emulsion method, since the surface of the crosslinked resin particles is easily plastified, fusion bonds frequently form between particles during the water removing step, resulting in large fused particles. In such instances, undesired water is trapped in the large fused particles. These problems are more pronounced when the resin component to be dispersed in water is thermoplastic and has a low glass transition temperature (Tg), such as for example, acryl rubber, polybutadiene, polyisoprene, polychloroprene, polyepsilon-caprolactone and polytetramethyleneglycol. Crosslinked resin particles prepared by the post-emulsion method from such thermoplastic resins have poor redispersibility in an aqueous medium, consequently these resin paricles have not been practically produced.

SUMMARY OF THE INVENTION

In the post-emulsion method of producing crosslinked resin particles the addition of specific components improves particle shape retention and storage stability and the resulting resin particles, when formulated into a photosensitive resin composition, have significantly improved water developability and storage stability. The present invention provides a photosensitive resin composition which comprises (I) crosslinked resin particles prepared by a post-emulsion method from
  (a) a base resin having a glass transition temperature (Tg) of 0° C. or less and a polymerizable double bond,
  (b) a monomer which, when polymerized, provides a resin in which Tg is 20° C. higher than that of the base resin, or a resin in which Tg is 20° C. higher than that of the base resin,
  (c) a polyvinyl compound, and
  (d) a polymerization initiator
(II) a photopolymerizable unsaturated monomer, and
(III) a photopolymerization initiator.

DETAILED DESCRIPTION OF THE INVENTION

The base resin (a) of the crosslinked resin particles (I) has a glass transition temperature (Tg) of 0° C. or less and a polymerizable double bond. Typical examples of resins (a) are acryl rubber (Tg=−10° to −40° C.), polybutadiene (Tg=−95° to −110° C.), polyisoprene (Tg=−63° to −72° C.), chloroprene (Tg=−45° C.), styrene-butadiene rubber (Tg=−40° C.), acrylonitrile-butadiene rubber (Tg=−20° to −50° C.), butyl rubber (Tg=−67° to −75° C.), poly-epsilon-caprolactone (Tg=−60° C.) and polytetramethyleneglycol (Tg=−40° to −100° C.). A block copolymer, such as styrene-butadiene-styrene (SBS) and styrene-isoprene-styrene (SIS), can also be used when the resin contains styrene in a small amount and the resin has an average glass transition temperature of 0° C. or less. Since the base resin (a) is dispersed in an aqueous medium, it is preferred that the above listed resins are modified by introducing a water dispersible or soluble group, if necessary. The modification is known to the art, but, for example, can be effected by introducing a maleic group which is neutralized with an amine, or by introducing a monomer having a hydrophilic group. The base resin preferably has a number average molecular weight of about 500 to 1,000,000.

The component (b) of the crosslinked resin particles (I) can be either a monomer or a resin, but it is necessary that the resin or the polymer obtained from the monomer have a transition temperature 20° C. higher than the base resin (a). Suitable examples of such resins are polystyrene (Tg=100° C.); acrylic resins, e.g. poly(methyl methacrylate) (Tg=105° C.), poly(ethyl methacrylate) (Tg=65° C.), poly(isopropyl methacrylate) (Tg=81° C.), poly(n-butyl methacrylate) (Tg=20° C.) and polyacrylonitrile (Tg=100° C.); epoxy resins (Tg=50° to 150° C.); polyamide resins (Tg=100° to 150° C.); and the like. Suitable examples of such monomers are styrene, methyl methacrylate, ethyl methacrylate, isopropyl methacrylate, n-butyl methacrylate, isobutyl methacrylate, acrylic acid, 2-hydroxyethyl methacrylate, acrylamide, vinyl acetate, acrylonitrile, glycidyl methacrylate, a mixture thereof and the like. The selection of suitable monomers is known to the art.

According to the present invention, a polyvinyl compound (c) is added to crosslink with the above mentioned components (a) and (b) in the presence of a polymerization initiator (d), especially a radical polymerization initiator. Compound (c) increases crosslinking of the resultant resin particles, and imparts high shape retention and good storage stability to the particles. For example, the resin particles are formulated into a photosensitive resin composition, the resin particles do not swell in monomers or solvents in the composition which imparts good shape retention to the composition. Also, since the resin particles do not swell, the particles, when developed, are easily removed from the cured resin composition to form hollows which the developing agent erodes quickly, thus enhancing water-devolopability. Suitable examples of polyvinyl compounds (c) are polyhydric (meth)acrylates, e.g. ethyleneglycol di(meth)acrylate, neopentylglycol di(meth)acrylate, trimethylolpropane tri(meth)acrylate, propyleneglycol di(meth)acrylate, 1,6-hexanediol di(meth)acrylate; divinylbenzene; trivinylbenzene; and the like.

The polymerization initiator (d) used in the crosslinking polymerization includes a heat-polymerization initiator, especially a radical polymerization initiator. The initiator can include solvent soluble initiators (e.g. azobisisobutylonitrile) and water soluble initiators (e.g. an amine salt of 4,4'-azobis-4-cyanovaleric acid).

The crosslinked resin particles (I) of the present invention are prepared by the post-emulsion method wherein the above mentioned four components (a), (b), (c) and (d) are dispersed in an aqueous medium and then crosslinked by heating. In the mixture of these four components, the base resin (a) may be present in an amount of about 60 to 99% by weight, preferably about 70 to 85% by weight, based on the total amount of the components (a), (b) and (c). Amounts of less than about 60% by weight reduce the rubber resilience of the resulting resin particles, and amounts of more than about 99% by weight reduce water developability. The component (b) may be present in an amount of about 0.9 to 30% by weight, preferably about 5 to 25% by weight, based on the total amount of the components (a), (b) and (c). Amounts of less than about 0.9% by weight reduce water developability and amounts of more than about 30% by weight decrease workability and reduce rubber resilience. The compound (c) may be present in an amount of about 0.1 to 10% by weight, preferably about 1.0 to 5.0% by weight, based on the total amount of the compounds (a), (b) and (c). If the compound (c) is less than about 0.1% by weight, the shape retention of the resin particles and the water developability of the resin composition are substantially reduced. If it is more than about 10% by weight, workability and rubber resilience are poor. The polymerization initiator (d) may be present in an amount of about 0.1 to 3 parts by weight based on 100 parts by weight of the total weight of the components (a), (b) and (c).

The above components (a), (b), (c) and (d) are dispersed in an aqueous medium. The aqueous medium preferably is water, or a combination of water and a hydrophilic organic solvent. Typical examples of hydrophilic organic solvents are a lower alcohol (e.g. methyl alcohol, ethyl alcohol and propyl alcohol), ethers (e.g. tetrahydrofuran, diethyl ether, ethyleneglycol monobutyl ether and ethyleneglycol monomethyl ether), and mixtures thereof and the like. The amount of the organic solvent is not limited as long as the resulting aqueous medium is uniform. The aqueous medium can contain both an emulsifier for controlling water dispersibility, and a viscosity modifier. The dispersing method is not limited. For example, if the polymerization initiator is solvent soluble, the components (a), (b), (c) and (d) can be mixed and then uniformly dispersed in the aqueous medium by shearing force, e.g. a homogenizer. The crosslinking reaction can be conducted during dispersing or after the dispersion is formed. The components (a), (b) and (c) can be dispersed in an aqueous medium, to which an emulsion of initiator (d) is added.

It is preferred that the crosslinking reaction is carried out at a temperature of about 40° to 100° C. for about 0.5 to 10 hours.

The resulting crosslinked resin particles can be isolated from the aqueous medium by known methods. For example, the aqueous medium can be removed from the resulting reaction mixture by drying methods, such as by spray drying or freeze drying to obtain dried resin particles. Also, an inorganic salt can be added to the reaction mixture to salt out the particles, and then filtered to isolate the resin particles which are then rinsed and dried.

The photopolymerizable unsaturated monomer (II) in the composition of the present invention is known in the art. The monomer contains an ethylenically unsaturated bond, preferably at least two ethylenically unsaturated bonds. Typical examples of the monomers (II) are unsaturated carboxylic acids (e.g. (meth)acrylic acid, maleic acid and itaconic acid), unsaturated carboxylic esters (e.g. n-butyl (meth)acrylate, 2-ethylhexyl (meth)acrylate, lauryl (meth)acrylate, stearyl (meth)acrylate, polyethyleneglycol mono(meth)acrylate, methoxypolyethyleneglycol mono(meth)acrylate, polypropyleneglycol mono(meth)acrylate, phenoxypolyethyleneglycol mono(meth)acrylate, ethyleneglycol di(meth)acrylate, diethyleneglycol di(meth)acrylate, triethyleneglycol di(meth)acrylate, diallyl itaconate, glycerol di(meth)acrylate, glycerol tri(meth)acrylate, 1,3-propyleneglycol di(meth)acrylate, 1,4-cyclohexanediol di(meth)acrylate, 1,2,4-butanetriol tri(meth)acrylate, glycerolpolypropyleneglycol tri(meth)acrylate, 1,4-benzenediol di(meth)acrylate, pentaerythritol tetra(meth)acrylate, tetramethyleneglycol di(meth)acrylate, 1,5-pentanediol di(meth)acrylate and 1,6-hexanediol di(meth)acrylate), unsaturated amides (e.g. methylene bis(meth)acrylamide, ethylene bis(meth)acrylamide, 1,6-hexamethylene bis(meth)acrylamide, diethylenetriamine tris(meth)acrylamide, N-(hydroxymethyl)acrylamide, N-(hydroxymethyl)methacrylamide, N-(beta-hydroxyethyl)acrylamide, N-(beta-hydroxyethyl)methacrylamide, N,N'-bis(beta-hydroxyethyl)acrylamide and N,N'-bis(beta-hydroxyethyl)methacrylamide), divinyl esters (e.g. divinyl adipate and divinyl phthalate), (meth)acrylated urethanes which are derived from an isocyanate compound and a hydroxyalkyl (meth)acrylate, di(meth)acrylic esters of diepoxypolyethers which are derived from aromatic compound and polyalcohol (e.g. di(meth)acrylic esters of diepoxypolyethers derived from bisphenols or nolac compounds) and a mixture thereof. Preferred are lauryl (meth)acrylate, 2-ethylhexyl (meth)acrylate, n-hexyl (meth)acrylate, stearyl (meth)acrylate, vinyltoluene and styrene. If the monomer (II) has an acidic group or basic group, in order to enhance the water developability of the resulting resin composition it may be neutralized and then formulated into the composition. For example, if the monomer (II) has an acidic group, it is partially or completely neutralized with a basic compound and then formulated into the composition. If the monomer has a basic group, it is partially or completely neutralized with an acidic compound and then formulated into the composition.

The photopolymerization initiator (III) in the present invention is one which is generally used in this field, for example, benzene ethers (e.g. benzoin isopropyl ether and benzoin isobutyl ether), benzophenones (e.g. benzophenone and methyl-o-benzoyl benzoate), xanthones (e.g. xanthone, thioxanthone and 2-chlorothioxanthone), acetophenones (e.g. acetophenone, trichloroacetophenone, 2,2-diethoxyacetophenone and 2,2-dimethoxy-2-phenylacetophenone), benzyl, 2-ethylanthraquinone, methylbenzoyl formate, 2-hydroxy-2-methylpropiophenone, 2-hydroxy-2-methyl-4′-isopropylisopropiophenone, 1-hydroxycyclohexyl phenyl ketone, mixtures thereof and the like.

In the photosensitive resin composition of the present invention, the resin particles (I) may be present in an amount of about 30 to 90 parts by weight, preferably 35 to 60 based on 100 parts by weight of the total weight of the components (I), (II) and (III). Amounts of less than about 30 parts by weight reduces the water developability of the resin plate and the water resistance of the cured resin plate. Amounts of more than about 90 parts by weight lower the hardness of the cured resin plate. The polyvinyl compound (II) may be present in an amount of about 5 to 70 parts by weight, preferably about 20 to 50 parts by weight based on 100 parts by weight of the total weight of the components (I), (II) and (III). Amounts of less than about 5 parts by weight provide poor photocurability and amounts of more than about 70 parts by weight reduce the shape retention of the resin plate. The component (III) may be present in an amount of about 0.01 to 10 parts by weight, preferably about 0.1 to 5.0 parts by weight based on 100 parts by weight of the total weight of the components (I), (II) and (III). Amounts of less than about 0.01 part by weight reduce photosensitivity and amounts of more than about 10 parts by weight provide poor images when cured.

The photosensitive resin composition of the present invention may further contain an additive, such as a surfactant (e.g. polyethyleneglycol nonyl phenyl ether), an antioxidant (e.g. 2,6-di-t-butyl-p-cresol), a polymerization inhibitor (e.g. hydroquinone and hydroquinone monomethyl ether), a solvent for controlling the viscosity (e.g. glycerol and sorbitan ester), and the like.

The photosensitive resin composition is prepared by an art known method, for example, by uniformly mixing the above mentioned components, using a kneader.

The photosensitive resin composition can be applied as a coating on a substrate (e.g. a primer-coated metal plate) and then exposed to light through a negative film. It can then be developed using a water development apparatus to remove uncured portions, thus obtaining a printing plate having relief images which are faithful with the negative film.

The crosslinked resin particles (I) of the present invention have rubber resilience which is provided by the base resin (a), the lack of fusion bonds between particles which are imparted by component (b), and excellent shape retention and water developability which are provided by polyvinyl compound (c). The resin particles are prepared by the post-emulsion method and therefore can be formed from various types of resins. If the particles are prepared by a usual emulsion method, the resin type is limited only to vinyl type resins which are prepared from vinyl monomers. Also, in the usual emulsion method, many of the monomers employed as starting materials have a low boiling point and volatilize into the air, which causes safety and other problems in production processes. In the post-emulsion method, crosslinked resin particles can be produced without using such volatile monomers, which improves the safety of the process and eliminates many productive problems.

The photosensitive resin composition contains the above mentioned crosslinked resin particles and therefore is significantly improved in water dispersibility and water developability. The resin particles have excellent shape retention even in the resin composition, and the storage stability of the composition is also enhanced. Printing plates produced from the photosensitive resin composition of the present invention have superior resilience, tranparency, hardness, durability and water resistance. Accordingly, these printing plate are suitable for printing with various types of inks, especially aqueous ink. The resin composition can also be used for producing printed circuits.

The present invention is illustrated by the following Examples which, however, are not to be construed as limiting the present invention to their details.

EXAMPLES

Reference Example 1

A reaction vessel equipped with a stirrer, a reflux condenser, a nitrogen gas inlet and a thermometer was charged with 500 parts by weight of a xylene solution (90% solid content) of polybutadiene having a number average molecular weight of 45,000 (available from Kuraray Co., Ltd as "LIR-300"), 30 parts by weight of maleic anhydride and one part by weight of N-phenyl-(1,3-dimethylbutyl)-p-phenyldiamine (available from Ouchi Shinko Kagaku Kogyl Co., Ltd. as "NOCRAC 6C") and reacted at 190° C. for 6 hours in a nitrogen atmosphere.

To the obtained maleic polybutadiene, 26 parts by weight of 2-hydroxyethyl methacrylate, 58 parts by weight of polyethyleneoxide monolauryl ether (available from Kao Corp. as Emulgen 109P), one part by weight of hydroquinone, 3 parts by weight of N,N-dimethylbenzylamine and 330 parts by weight of xylene were added and reacted at 135° C. for 30 minutes.

The resulting resin has a solids content of 60% by weight, a number average molecular weight of 56,400 and a resin content acid value of 38. Its IR spectrum showed the presence of a polymerizable double bond. The resin had a Tg of −98° C. determined by DSC.

Reference Example 2

A reaction vessel equipped with a stirrer, a reflux condenser, a nitrogen gas inlet and a thermometer was charged with 500 parts by weight of a xylene solution (90% solid content) of polyisoprene having a number average molecular weight of 29,000 (available from Kuraray Co., Ltd as "LIR-30"), 30 parts by weight of maleic anhydride and one part by weight of N-phenyl-(1,3-dimethylbutyl)-p-phenyldiamine (available from Ouchi Shinko Kagaku Kogyl Co., Ltd. as "NOCRAC 6C") and reacted at 190° C. for 6 hours in a nitrogen atmosphere.

To the resulting maleic polybutadiene, 26 parts by weight of 2-hydroxyethyl methacrylate, 58 parts by weight of polyethyleneoxide monolauryl ether (available from Kao Corp. as "Emulgen 109P"), one part by weight of hydroquinone, 3 parts by weight of N,N-dimethylbenzylamine and 330 parts by weight of xylene were added and reacted at 135° C. for 30 minutes.

The obtained resin has a solids content of 60% by weight, a number average molecular weight of 40,400 and a resin content acid value of 40. Its IR spectrum showed the presence of a polymerizable double bond. The resin had a Tg of −65° C. determined by DSC.

Reference Example 3

A reaction vessel equipped with a stirrer, a reflux condenser, a nitrogen gas inlet and a thermometer was charged with 192 parts by weight of trimellitate anhydride, 244 parts by weight of a 1:1 mol adduct of 2-hydroxyethyl methacrylate and epsilon-caprolactone (available from Daicel Chemical Industry Ltd. as "Praccel FM-1"), 100 parts by weight of cyclohexane and 0.1 part by weight of hydroquinone, and reacted at 150° C. for 0.5 hours in a nitrogen atmosphere.

To the obtained mixture, 740 parts by weight of polytetramethyleneglycol diglycidyl ether (available from Nagase Kasei Kogyo Co., Ltd. as "Deconal 992"), 400 parts by weight of cyclohexane and 0.1 part by weight of hydroquinone were added and reacted at 150° C. for 60 minutes.

The resulting resin has a solids content of 70% by weight, a number average molecular weight of 2,400 and a resin content acid value of 48. Its IR spectrum showed the presence of a polymerizable double bond. The resin had a Tg of −60° C. determined by DSC.

Production Example 1

Dispersing Step

A uniform mixture was prepared by mixing 140 parts by weight of the resin of Reference Example 1 which was neutralized 100% with dimethylethanolamine, 20 parts by weight of methyl methacrylate and 2 parts by weight of divinylbenzene. To the mixture, 450 parts by weight of deionized water and 50 parts by weight of n-propyl alcohol were added and emulsified at 70° C. for 30 minutes by a homogenizer.

Crosslinking Step

The obtained emulsion was charged in a reaction vessel equipped with a stirrer, a reflux condenser, a nitrogen gas inlet and a thermometer, to which 100 parts by weight of an aqueous solution of one part by weight of 4,4'-azobis-4-cyanovaleric acid (available from Otsuka Chemical Co., Ltd. as "A.C.V.A.") which was neutralized 100% with methylethanolamin, was added and reacted at 85° C. for 2 hours in a nitrogen atmosphere. The resulting resin emulsion which was examined with an electron microscope had an average particle size in the resin emulsion of 110 nm.

Removal step from the aqueous medium

One percent calcium chloride solution was slowly added to the obtained emulsion with stirring to salt out the resin particles in the form of small agglomerates (0.1 to several mm particle size), which were filtered, rinsed and dried at 0.5 torr at 45° C. to obtain dried resin particles.

Production Example 2

Dispersing Step

A uniform mixture was prepared by mixing 140 parts by weight of the resin of Reference Example 1 which was neutralized 100% with dimethylethanolamine, 20 parts by weight of styrene and 3 parts by weight of 1,6-hexanediol dimethacrylate. To the mixture, 450 parts by weight of deionized water and 50 parts by weight of n-propyl alcohol were added and emulsified at 70° C. for 30 minutes with an homogenizer.

Crosslinking Step

The resulting emulsion was charged in a reaction vessel equipped with a stirrer, a reflux condenser, a nitrogen gas inlet and a thermometer, to which 100 parts by weight of an aqueous solution of one part by weight of 4,4'-azobis-4-cyanovaleric acid (available from Otsuka Chemical Co., Ltd. as "A.C.V.A.") which was neutralized 100% with methylethanolamine, was added and reacted at 85° C. for 2 hours in a nitrogen atmosphere. The resulting resin emulsion which was examined with an electron microscope had an average particle size in the resin emulsion of 124 nm.

Removal Step From The Aqueous Medium

One percent calcium chloride solution was slowly added to the obtained emulsion with stirring to salt out the resin particles in the form of small agglomerates (0.1 to several mm particle size), which were filtered, rinsed and dried at 0.5 torr at 45° C. to obtain dried resin particles.

Production Example 3

Dispersing Step

A uniform mixture was prepared by mixing 140 parts by weight of the resin of Reference Example 1 which was neutralized 100% with dimethylethanolamine, 100 parts by weight of a 20% xylene solution of poly(methyl methacrylate) having a number average molecular weight of 300,000 and 3 parts by weight of neopentylglycol dimethacrylate. To the mixture, 450 parts by weight of deionized water and 50 parts by weight of n-propyl alcohol were added and emulsified at 70° C. for 30 minutes with an homogenizer.

Crosslinking Step

The obtained emulsion was charged in a reaction vessel equipped with a stirrer, a reflux condenser, a nitrogen gas inlet and a thermometer, to which 100 parts by weight of an aqueous solution of one part by weight of 4,4'-azobis-4-cyanovaleric acid (available from Otsuka Chemical Co., Ltd. as "A.C.V.A.") which was neutralized 100% with methylethanolamine, was added and reacted at 85° C. for 2 hours in a nitrogen atmosphere. The resulting resin emulsion which was examined with an electron microscope had an average particle size in the resin emulsion of 145 nm.

Removal Step From The Aqueous Medium

One % calcium chloride solution was slowly added to the obtained emulsion with stirring to salt out the resin particle in the form of small agglomerates (0.1 to several mm particle size), which were filtered, rinsed and dried at 0.5 torr at 45° C. to obtain dried resin particles.

Production Example 4

Dispersing Step

A uniform mixture was prepared by mixing 120 parts by weight of the resin of Reference Example 1 which was neutralized 100% with dimethylethanolamine, 60 parts by weight of a 50% butyl acetate solution of bisphenol type epoxy resin (available from Toto Chemical Co., Ltd. as YD-014) and 0.5 parts by weight of ethyleneglycol dimethacrylate. To the mixture, 450 parts by weight of deionized water and 50 parts by weight of n-propyl alcohol were added and emulsified at 70° C. for 30 minutes with an homogenizer.

Crosslinking Step

The resulting emulsion was charged in a reaction vessel equipped with a stirrer, a reflux condenser, a nitrogen gas inlet and a thermometer, to which 100 parts by weight of an aqueous solution of one part by weight of 4,4'-azobis-4-cyanovaleric acid (available from Otsuka Chemical Co., Ltd. as "A.C.V.A.") which was neutralized 100% with methylethanolamine, was added and reacted at 85° C. for 2 hours in a nitrogen atmosphere. The resulting resin emulsion which was examined with an electron microscope had an average particle size in the resin emulsion of 131 nm.

Removal Step From The Aqueous Medium

One percent calcium chloride solution was slowly added to the obtained emulsion with stirring to salt out the resin particles in the form of small agglomerates (0.1 to several mm particle size), which were filtered, rinsed and dried at 0.5 torr at 45° C. to obtain dried resin particles.

Production Example 5

Dispersing Step

A uniform mixture was prepared by mixing 120 parts by weight of the resin of Reference Example 2 which was neutralized 100% with dimethylethanolamine, 15 parts by weight of styrene, 15 parts by weight of ethyl methacrylate and 10 parts by weight of propyleneglycol diacrylate. To the mixture, 450 parts by weight of deionized water and 50 parts by weight of n-propyl alcohol were added and emulsified at 70° C. for 30 minutes with an homogenizer.

Crosslinking Step

The resulting emulsion was charged in a reaction vessel equipped with a stirrer, a reflux condenser, a nitrogen gas inlet and a thermometer, to which 100 parts by weight of an aqueous solution of one part by weight of 4,4'-azobis-4-cyanovaleric acid (available from Otsuka Chemical Co., Ltd. as "A.C.V.A.") which was neutralized 100% with methylethanolamine, was added and reacted at 85° C. for 2 hours in a nitrogen atmosphere. The resulting resin emulsion which was examined with an electron microscope had an average particle size in the resin emulsion of 254 nm.

Removal Step From The Aqueous Medium

One percent calcium chloride solution was slowly added to the obtained emulsion with stirring to salt out the resin particles in the form of small agglomerates (0.1 to several mm particle size), which were filtered, rinsed and dried at 0.5 torr at 45° C. to obtain dried resin particles.

Production Example 6

Dispersing Step

A uniform mixture was prepared by mixing 120 parts by weight of the resin of Reference Example 2 which was neutralized 100% with dimethylethanolamine, 150 parts by weight of a 20 % xylene solution of polystyrene having a number average molecular weight of 300,000 and 0.1 parts by weight of trivinylbenzene. To the mixture, 450 parts by weight of deionized water and 50 parts by weight of isopropyl alcohol were added and emulsified at 70° C. for 30 minutes with an homogenizer.

Crosslinking Step

The resulting emulsion was charged in a reaction vessel equipped with a stirrer, a reflux condenser, a nitrogen gas inlet and a thermometer, to which 100 parts by weight of an aqueous solution of one part by weight of 4,4'-azobis-4-cyanovaleric acid (available from Otsuka Chemical Co., Ltd. as "A.C.V.A." which was neutralized 100% with methylethanolamine, was added and reacted at 85° C. for 2 hours in a nitrogen atmosphere. The resulting resin emulsion which was examined with an electron microscope had an average particle size in the resin emulsion of 190 nm.

Removal Step From The Aqueous Medium

One % calcium chloride solution was slowly added to the obtained emulsion with stirring to salt out the resin particles in the form of small agglomerates (0.1 to several mm particle size), which were filtered, rinsed and dried at 0.5 torr at 45° C. to obtain dried resin particles.

Production Examlpe 7

Dispersing Step

A uniform mixture was prepared by mixing 140 parts by weight of the resin of Reference Example 3 which was neutralized 100% with dimethylethanolamine, 67 parts by (available from Daicel Huls Co., Ltd. as "Diamide-PAR"), 1 part by weight of trimethylolpropane triacrylate and 1 part by weight of 2,2'-azobis-(2,4-dimethylvalelonitrile) (available from Wako Junyaku Co., Ltd. as "V-65"). To the mixture, 600 parts by weight of deionized water was added and emulsified at 70° C. for 30 minutes with an homogenizer.

Crosslinking Step

The resulting emulsion was charged in a reaction vessel equipped with a stirrer, a reflux condenser, a nitrogen gas inlet and a thermometer, and reacted at 75° C. for 1 hour in a nitrogen atmosphere. The obtained resin emulsion which was examined with an electron microscope had an average particle size in the resin emulsion of 70 nm.

Removal Step From The Aqueous Medium

One percent calcium chloride solution was slowly added to the obtained emulsion with stirring to salt out the resin particles in the form of small agglomerates (0.1 to several mm particles size), which were filtered, rinsed and dried at 0.5 torr at 45° C. obtain dried resin particles.

Production Example 8

Dispersing Step

A uniform mixture was prepared by mixing 60 parts by weight of polytetramethyleneglycol diacrylate having a number average molecular weight of 1,200 (available from Hodogaya Chemical Co., Ltd. as "AC-PTG 1000"), 2 parts by weight of N,N-dimethylaminoethyl acrylate, 1 part by weight of acrylonitrile, 5 parts by weight of ethyleneglycol diacrylate, 2 parts by weight of 2-hydroxyethyl methacrylate, 30 parts by weight of isopropyl methacrylte and 1 part by weight of azobisisobutylonitrile (available from Wako Junyaku Co., Ltd.) To the mixture, 400 parts by weight of a 1% aqueous solution of sodium laurylsulfate was added and emulsified at 70° C. for 30 minutes with an homogenizer.

Crosslinking Step

The resulting emulsion was charged in a reaction vessel equipped with a stirrer, a reflux condenser, a nitrogen gas inlet and a thermometer, and reacted at 75° C. for 1 hour in a nitrogen atmosphere. The resulting resin emulsion which was examined with an electron microscope had an average particle size in the resin emulsion of 120 nm.

Removal Step From The Aqueous Medium

The obtained emulsion was spray-dried to obtain dried resin particles.

Production Example 9

Dispersing Step

A uniform mixture was prepared by mixing 96 parts by weight of a butadiene-acrylonitrile copolymer having vinyl groups at both ends and a number average molecular weight of 3,500 (available from Ube Kosan Co., Ltd. as "HYCAR VTBNX BOOX 23"), 1 part by weight of divinylbenzene, 2 parts by weight of N,N-dimethylaminoethoxyethyl acrylate and 10 parts by weight of the resin of Reference Example 1 which was neutralized 100% with dimethylethanolamine. To the mixture, 900 parts by weight of deionized water and 90 parts by weight of isopropyl alcohol were added and emulsified at 70° C. for 30 minutes with an homogenizer.

Crosslinking Step

The resulting emulsion was charged in a reaction vessel equipped with a stirrer, a reflux condenser, a nitrogen gas inlet and a thermometer, to which 100 parts by weight of an aqueous solution of one part by weight of 4,4'-azobis-4-cyanovaleric acid (available from Otsuka Chemical Co., Ltd. as "A.C.V.A.") which was neutralized 100% with methylethanolamine was added and reacted at 85° C. for 2 hours in a nitrogen atmosphere. The resulting resin emulsion which was examined with an electron microscope had an average particle size in the resin emulsion of 100 nm.

Removal Step From The Aqueous Medium

The resulting emulsion was freeze-dried to obtain dried resin particles.

Comparative Production Example 1

Dispersing Step

A uniform mixture was prepared by mixing 140 parts by weight of the resin of Reference Example 1 which was neutralized 100% with dimethylethanolamine and 20 parts by weight of methyl methacrylate. To the mixture, 450 parts by weight of deionized water and 50 parts by weight of n-propyl alcohol were added and emulsified at 70° C. for 30 minutes with an homogenizer.

Crosslinking Step

The resulting emulsion was charged in a reaction vessel equipped with a stirrer, a reflux condenser, a nitrogen gas inlet and a thermometer, to which 100 parts by weight of an aqueous solution of one part by weight of 4,4'-azobis-4-cyanovaleric acid (available from Otsuka Chemical Co., Ltd. as "A.C.V.A.") which was neutralized 100% with methylethanolamine, was added and reacted at 85° C. for 2 hours in a nitrogen atmosphere. The resulting resin emulsion which was examined with an electron microscope had an average particle size in the resin emulsion of 100 nm.

Removal Step From The Aqueous Medium

One percent calcium chloride solution was slowly added to the obtained emulsion with stirring to salt out the resin particles in the form of small agglomerates (0.1 to several mm particle size), which were filtered, rinsed and dried at 0.5 torr at 45° C. to obtain dried resin particles.

Example 1

To 60 parts by weight of the dried particles of Production Example 1, 5.8 parts by weight of N,N-dimethylaminopropyl methacrylamide, 5.5 parts by weight of polyethyleneglycol nonyl phenyl ether, 5.5 parts by weight of phenoxyethoxyethanol, 11 parts by weight of dipropyleneglycol monomethyl monoacrylate, 5.0 parts by weight of nonaethyleneglycol diacrylate, 5.0 parts by weight of trimethylolpropane trimethacrylate, 1.8 parts by weight of 2,2-dimethoxy-2-phenylacetophenone and 0.4 parts by weight of 2,6-di-t-butyl-p-cresol were added and uniformly mixed using a pressured biaxial kneader. The obtained photosensitive resin composition was extruded onto an iron plate, using a kneader extruder having a T die to obtain a resin plate having a photosensitive resin layer of 0.40 mm.

A negative film having images was then contacted with the photosensitive resin layer of the resin plate and exposed to a chemical lamp of 350 W for one hour. It was developed with water at 40° C. to obtain relief images which were faithful with the negative images.

Using the resulting printing plate, printing was conducted with an aqueous flexographic ink at 600 feet/min, using a flexographic printing apparatus, but no change on the relief surface was observed after printing on 150,000 pieces of paper.

Examples 2 to 7

The printing plate was prepared as generally described in Example 1, with the exception that 60 parts by weight of dried particles of each one of Production Examples 2 to 7 were employed instead of the particles of Production Example 1.

Using the obtained printing plate, printing was conducted with an aqueous flexographic ink at 600 feet/min, using a flexographic printing apparatus, but no change on the relief surface was observed after printing on 150,000 pieces of paper.

Example 8

To 60 parts by weight of the dried particles of Production Example 8, 5.8 parts by weight of methacrylic acid, 5.5 parts by weight of polyethyleneglycol nonyl phenyl ether, 5.5 parts by weight of phenoxyethoxyethanol, 11 parts by weight of dipropyleneglycol monomethyl monoacrylate, 5.0 parts by weight of nonaethyleneglycol diacrylate, 5.0 parts by weight of trimethylolpropane trimethacrylate, 1.8 parts by weight of 2,2-dimethoxy-2-phenylacetophenone and 0.4 parts by weight of 2,6-di-t-butyl-p-cresol were added and uniformly mixed using a pressured biaxial kneader. The obtained photosensitive resin composition was extruded onto an iron plate, using a kneader extruder having a T die to obtain a resin plate having a photosensitive resin layer of 0.40 mm.

A negative film having images was then contacted with the photosensitive resin layer of the resin plate and exposed to a chemical lamp of 350 W for one hour. It was developed with water at 40° C. to obtain relief images which were faithful with the negative images.

Using the obtained printing plate, printing was conducted with an aqueous flexographic ink at 600 feet/min, using a flexographic printing apparatus, but no change on the relief surface was observed after printing on 150,000 pieces of paper.

Example 9

The printing plate was prepared as generally described in Example 8, with the exception that 60 parts by weight of dried particles of Production Example 9 were employed instead of the particles of Production Example 8.

Using the obtained printing plate, printing was conducted with an aqueous flexographic ink at 600 feet/min, using a flexographic printing apparatus, but no change on the relief surface was observed after printing on 150,000 pieces of paper.

Example 10

To 60 parts by weight of the dried particles of Production Example 1, 5.8 parts by weight of N,N-dimethylaminopropyl methacrylamide, 5.5 parts by weight of polyethyleneglycol nonyl phenyl ether, 5.5 parts by weight of phenoxyethoxyethanol, 11 parts by weight of dipropyleneglycol monomethyl monoacrylate, 5.0 parts by weight of HX-620 (pentaerythritol poly-epsilon-caprolactone diacrylate available from Nippon Kayaku Co., Ltd.), 5.0 parts by weight of diethyleneglycol dimethacrylate, 1.8 parts by weight of 2,2-dimethoxy-2-phenylacetophenone and 0.4 parts by weight of 2,6-di-t-butyl-p-cresol were added and uniformly mixed using a pressured biaxial kneader. The obtained photosensitive resin composition was extruded in the form of a sheet and simultaneously low-pressure pressed at 80° C. onto a substrate through a spacer to obtain a resin plate having a photosensitive resin layer of 0.40 mm.

A negative film having images was then contacted with the photosensitive resin layer of the resin plate and exposed to a chemical lamp of 350 W for one hour. It was developed with water at 40° C. to obtain relief images which were faithful with the negative images.

Using the obtained printing plate, printing was conducted with an aqueous flexographic ink for news paper at 120 feet/min, using a flexographic printing apparatus, but printing was smoothly conducted without any spotted portions.

Examples 11 to 16

The printing plate was prepared as generally described in Example 10, with the exception that 60 parts by weight of dried particles of each one of Production Examples 2 to 7 were employed instead of the particles of Production Example 1.

Using the obtained printing plate, printing was conducted as generally described in Example 10, good and distinctive printed images were obtained.

Example 17

To 60 parts by weight of the dried particles of Production Example 8, 5.8 parts by weight of methacrylic acid, 5.5 parts by weight of polyethyleneglycol nonyl phenyl ether, 5.5 parts by weight of phenoxyethoxyethanol, 11 parts by weight of dipropyleneglycol monomethyl monoacrylate, 5.0 parts by weight of HX-620 (pentaerythritol poly-epsilon-caprolactone acrylate available from Nippon Kayaku Co., Ltd.), 5.0 parts by weight of diethyleneglycol dimethacrylate, 1.8 parts by weight of 2,2-dimethoxy-2-phenylacetophenone and 0.4 parts by weight of 2,6-di-t-butyl-p-cresol were added and uniformly mixed using a pressured biaxial kneader. The obtained photosensitive resin composition was extruded onto an iron plate, using a kneader extruder having a T die to obtain a resin plate having a photosensitive resin layer of 0.40 mm.

Using the obtained printing plate, printing was conducted as generally described in Example 10, and good and distinctive printed images were obtained.

Example 18

The printing plate was prepared as generally described in Example 17, with the exception that 60 parts by weight of dried particles of Production Example 9 were employed instead of the particles of Production Example 8.

Using the obtained printing plate, printing was conducted as generally described in Example 10, and good and distinctive printed images were obtained.

Test for Water Developability and Storage Stability

A printing plate was prepared as generally described in Example 1, with the exception that 60 parts by weight of the dried particles of Comparative Production Example 1 were employed instead of the particles of Production Example 1.

Two plates obtained above and two plates obtained in Example 1 were subjected to tests.

Each plate of Comparative one and Example 1 was exposed and developed as generally described in Example 1. The period of time for developing with water of 40° C. was measured and its results are shown in Table 1. The remaining plates were placed at 40° C. for one week in a dark room. The period of time for developing with water at 40° C. was also measured and the results are shown in Table 1.

TABLE 1

| Photosensitive resin plate | Water developing time (sec.) | Water developing time after 1 week (sec.) |
|---|---|---|
| Example 1 | 20 | 20 |
| Comparative Production Example 1 | 30 | 60 |

As is apparent from the above results, the photosensitive resin composition of the present invention has superior water developability in comparison with that obtained using the resin particles of Comparative Production Example 1 which do not contain the polyvinyl compound (c). The resin plate of Example 1, after being stored at 40° C. in a dark room for a long period, is easily developed with water, and no cure is observed.

What is claimed is:

1. A photosensitive resin composition consisting essentially of:
    30 to 90 parts by weight, based on 100 parts by weight of the components (I), (II) and (III), of crosslinked resin particles having a particle size of less than several mm prepared by dispersing in an aqueous medium the following four components:

(a) 60 to 90% by weight, based on the total amount of the components (a), (b) and (c), of a base resin having a glass transition temperature (Tg) of 0° C. or less and a polymerizable double bond, (b) 0.9 to 30% by weight, of based on the total amount of the components (a), (b) and (c), of a monomer which, when polymerized, provides a resin in which Tg is 20° C. higher than that of said base resin, or a resin in which Tg is 20° C. higher than that of said base resin, (c) 0.1 to 10% by weight, based on the total amount of the components (a), (b) and (c) of a polyvinyl compound, and (d) 0.1 to 3 parts by weight, based on 100 parts by weight of the total weight of the components (a), (b) and (c), of a polymerization initiator, components (a), (b), (c) and (d) having been heated to crosslink, (II) 5 to 70 parts by weight, based on 100 parts by weight of the components (I), (II) and (III), of a photopolymerizable unsaturated monomer, and (III) 0.01 to 10 parts by weight, based on 100 parts by weight of the components (I), (II) and (III), of a photopolymerization initiator.

2. The composition according to claim 1 wherein said base resin (a) is selected from the group consisting of acryl rubber (Tg=−10° to −40° C.), polybutadiene (Tg=−95° to −110° C.), polyisoprene (Tg=−63° to −72° C.), chloroprene (Tg=−45° C.), styrene-butadiene rubber (Tg=−40° C.), acrylonitrile-butadiene rubber (Tg=−20° to −50° C.), butyl rubber (Tg=−67° to −75° C.), poly-epsilon-caprolactone (Tg=−60° C.) and polytetramethyleneglycol (Tg=−40° to −100° C.).

3. The composition according to claim 1 wherein said base resin is modified by introducing a water dispersible or soluble group.

4. The composition according to claim 1 wherein said base resin has a number average molecular weight of 500 to 1,000,000.

5. The composition according to claim 1 wherein said monomer of the component (b) is selected from the group consisting of styrene, methyl methacrylate, ethyl methacrylate, isopropyl methacrylate, n-butyl methacrylate, isobutyl methacrylate, acrylic acid, 2-hydroxyethyl methacrylate, acrylamide, vinyl acetate, acrylonitrile, glycidyl methacrylate and mixtures thereof.

6. The composition according to claim 1 wherein said resin of the component (b) is selected from the group consisting of polystyrene (Tg=100° C.), poly(methyl methacrylate) (Tg=105° C.), poly(ethyl methacrylate) (Tg=65° C.), poly(isopropyl methacrylate) (Tg=81° C.), poly(n-butyl methacrylate) (Tg=20° C.), poly-acrylonitrile (Tg=100° C.), an epoxy resin (Tg=50° to 150° C.) and a polyamide resin (Tg=100° to 150° C.).

7. The composition according to claim 1 wherein said compound (c) is selected from the group consisting of ethyleneglycol di(meth)acrylate, neopentylglycol di(meth)acrylate, trimethylolpropane tri(meth)acrylate, propyleneglycol di(meth)acrylate, 1,6-hexanediol di(meth)acrylate, divinylbenzene, trivinylbenzene and mixtures thereof.

8. The composition according to claim 1 wherein said polymerization initiator (d) is azobisisobutylonitrile or an amine salt of 4,4'-azobis-4-cyanovaleric acid.

9. The composition according to claim 1 wherein said resin particles are prepared from about 60 to 99% by weight of the base resin (a), about 0.9 to 30% by weight of the component (b) and about 0.1 to 10% by weight of the compound (c), said % being based on the total amount of the components (a), (b) and (c).

10. The composition according to claim 1 wherein said polymerization initiator (d) is present in an amount of about 0.1 to 3 parts by weight based on 100 parts by weight of the total weight of the components (a), (b) and (c).

11. The composition according to claim 1 wherein said crosslinked resin particles (I) are prepared by the post-emulsion method wherein said four components (a), (b), (c) and (d) are dispersed in an aqueous medium and then crosslinked by heating.

12. The composition according to claim 1 wherein said crosslinked resin particles (I) are isolated from the aqueous medium.

13. The composition according to claim 1 wherein said photopolymerizable monomer (II) is selected from the group consisting of unsaturated carboxylic acids, unsaturated carboxylic esters, unsaturated amides, divinyl esters, (meth)acrylated urethanes and (meth)acrylate of diepoxypolyethers derived from aromatic compounds and polyalcohols.

14. The composition according to claim 1 wherein said photopolymerization initiator (III) is selected from the group consisting of benzene ethers, benzophenones, xanthones, acetophenones, benzyl, 2-ethylanthraquinone, methylbenzoyl formate, 2-hydroxy-2-methylpropiophenone, 2-hydroxy-2-methyl-4'-isopropylisopropiophenone, 1-hydroxycyclohexyl phenyl ketone and mixtures thereof.

15. The composition according to claim 1 comprising about 30 to 90 parts by weight of said resin particles (I), about 5 to 70 parts by weight of the monomer (II) and about 0.01 to 10 parts by weight of the initiator (III).

16. The composition according to claim 1 further comprising a surfactant, an antioxidant, a polymerization inhibitor and a solvent for controlling the viscosity.

* * * * *